United States Patent [19]

Hoge

[11] Patent Number: 5,313,015

[45] Date of Patent: May 17, 1994

[54] GROUND PLANE SHIELD

[75] Inventor: William Hoge, Palmyra, N.Y.

[73] Assignee: Schlegel Corporation, Rochester, N.Y.

[21] Appl. No.: 816,143

[22] Filed: Dec. 31, 1991

[51] Int. Cl.$^5$ .................... H05K 9/00; H05K 1/18; H01R 43/00

[52] U.S. Cl. .................. 174/35 R; 174/250; 174/261; 174/262; 29/874; 29/825; 29/854; 361/760; 361/762; 361/816

[58] Field of Search ............... 174/35 R, 35 MS, 250, 174/256, 257, 258, 259, 261, 262, 255; 361/424, 412, 413, 400, 401; 29/825, 854, 874, 592.1

[56] References Cited

U.S. PATENT DOCUMENTS

| | | | |
|---|---|---|---|
| 1,641,395 | 9/1927 | Moore . | |
| 1,942,575 | 1/1934 | Shapiro | 250/16 |
| 2,955,974 | 10/1960 | Allen et al. | 154/128 |
| 3,222,442 | 12/1965 | Parker et al. | 264/277 |
| 3,375,576 | 4/1968 | Klein et al. | 29/626 |
| 3,731,202 | 5/1973 | Meyers | 325/357 |
| 4,510,553 | 4/1985 | Faultersack | 361/413 |
| 4,649,461 | 3/1987 | Matsuta | 361/415 |
| 4,654,755 | 3/1987 | Henderson et al. | 361/399 |
| 4,811,168 | 3/1989 | Chestnut et al. | 361/399 |
| 4,840,571 | 6/1989 | Minata et al. | 439/76 |
| 4,857,668 | 8/1989 | Buonanno | 174/35 |
| 4,933,045 | 6/1990 | DiStefano et al. | 156/630 |
| 4,933,208 | 6/1990 | Dorinski | 427/96 |
| 4,933,228 | 6/1990 | Katagiri et al. | 428/209 |

FOREIGN PATENT DOCUMENTS 1248699 10/1989 Japan .................. 361/424

Primary Examiner—Leo P. Picard
Assistant Examiner—Bot L. Ledynh
Attorney, Agent, or Firm—Eckert Seamans Cherin & Mellott

[57] ABSTRACT

A laminated groundplane structure for shielding electrical equipment such as printed circuit boards has a conductive sheet sandwiched between a soft foam layer and a rigid foam layer. A connection pin coupled to the printed circuit board or the like pierces the soft foam layer to engage in the conductive sheet. The groundplane can include, in order, laminated layers of soft closed cell foam, an insulating dielectric layer, a conductive fabric defining the conductive sheet, and a relatively rigid foam for maintaining a shape in the groundplane structure. The connection pin includes a conductive post protruding toward the groundplane, and a movable conductive shaft which is spring biased to protrude axially relative to the conductive post for piercing the conductive sheet through the soft foam layer The movable shaft resembles a twist drill with an enlarged or barbed head, which passes through the conductive sheet to engage in filaments of the conductive sheet. The conductive shaft is helically fluted over at least a part of its length engaging the filaments of the conductive sheet. The arrangement is particularly useful in mounting circuit cards in conductive housings of equipment subject to vibration, for example automobiles, because the groundplane structure resiliently cradles the circuit card while the connection pin bites into the conductive sheet due to engagement of the barbed head, the fluted shaft and the filaments of the sheet.

17 Claims, 2 Drawing Sheets

GROUND PLANE SHIELD

BACKGROUND OF THE INVENTION

1. Field of the Invention

This invention relates to the field of structures for at least partly blocking or enclosing equipment against the passage of electromagnetic interference. In particular the invention concerns a shielding ground plane structure comprising a laminate of conductive material and elastomeric foam, wherein the conductive material is electrically coupleable to a circuit board or the like by means of a spring pin that resembles a twist drill, and pierces the foam and the conductive material to make a connection such as a grounding connection to the conductive material at the spring pin.

2. Prior Art

Shielding to damp or block the passage of electromagnetic interference is well known in connection with electrical equipment which either generates an electromagnetic field or is sensitive to induction of currents from incident electromagnetic fields. Radio equipment, computing equipment and the like often include a grounded conductive enclosure at least for the high frequency portions of the circuitry to block propagation of the fields generated therein and thus avoid affecting nearby circuitry. Such an enclosure may or may not wholly enclose the circuits which generate or are sensitive to electromagnetic interference. In connection with a particular circuit board, for example, a simple grounded conductive sheet disposed adjacent the conductors of the circuit board can reduce electromagnetic interference that otherwise would couple high frequency signals among the components on the circuit board. Electromagnetic radiation incident on the grounded sheet induces currents in the sheet that are dissipated as eddy currents A wide variety of uses of conductive sheets for shielding and the like are possible.

In connection with a sheet which is to function as a ground plane, i.e., a conductive plane which is electrically connected to circuit ground, it would be possible to connect the conductive sheet to ground at various points However, it is useful to consider carefully the particular connections to be made to a ground plane because if even a small electrical potential exists between the points of connection to the ground plane, substantial currents can be generated between the points due to the normally low electrical resistance of the conductive sheet Such currents generate electromagnetic fields which propagate to cause emission of electromagnetic interference and/or high frequency coupling of elements on the circuit card. This problem can be minimized by grounding a number of circuit grounds at a common point forming the reference ground.

Some examples of shielding techniques involving conductive enclosures and/or ground planes are disclosed, for example, in U.S. Pat. Nos. 4,840,571—Minata et al; 3,731,202—Meyers; and 1,641,395—Moore. A full or partial conductive enclosure is connected to the circuit ground of an electrical apparatus to block propagation of electromagnetic interference. Arrangements involving the insertion of conductor pins into mating receptacles for achieving connection of circuit cards to a housing, backplane or groundplane are disclosed, for example, in U.S. Pat. Nos. 4,811,168—Chesnut et al; 4,649,461—Matsuta; 4,510,553—Faultersack; and 3,375,576—Klein et al. Rigid soldered connections between points on multilayer circuit cards are disclosed in U.S. Pat. Nos. 4,933,228—Katagiri et al and 4,933,208—Dorinski.

A conductive sheet or enclosure for blocking electromagnetic propagation may be rigid or flexible. U.S. Pat. No. 1,942,575—Shapiro discloses a material which comprises woven conductive strands forming a conductive fabric. Provided any gaps in the conductive sheet between filaments of the weave are small compared to the wave length of the frequency of interest, such a material will effectively block propagation Flexibility also has advantages in that the material will assume a desired shape. Another form of flexible conductive material is the metal plated plastic fabric disclosed in U.S. Pat. No. 4,857,668—Buonanno, wherein a nylon knit or weave is electroplated to provide a conductive element in a seal or gasket.

It is sometimes desirable, particularly in printed circuit boards, to build a conductive sheet directly into the structure of the printed circuit board. A metal layer which can be photo-etched is applied to one or both sides of a circuit card, and after etching forms the conductors which couple particular circuit pins. The metal on an area of the opposite side can be left as a groundplane, connected to ground on the conductor (component) side to reduce propagation to or from components on the printed circuit board. In U.S. Pat. Nos. 4,933,045 DiStefano et al; 4,654,755 Henderson et al; and 2,955,974—Allen et al, laminates of metal and plastic are disclosed. U.S. Pat. No. 3,222,442—Parker et al discloses using plastic (in particular a polystyrene foam) as a means to position components while an insulating base or circuit card is formed to engage the leads of the components.

The structure needed functionally to effect a groundplane or similar shield is relatively simple, including a conductive sheet and a conductor passing from a circuit ground on the shielded apparatus to a point on the conductive sheet. However, the specific manner in which the sheet and the connection are embodied are subject to practical requirements. For example, the designer must avoid allowing the conductors of the circuit (apart from the grounding conductor) to short against the groundplane The groundplane should be protected from contact with any conductive outer housing to avoid altering the characteristics of the groundplane arrangement In an apparatus subject to vibration, some form of flexible or resilient coupling is needed, and preferably the connection structure is dimensionally tolerant.

According to the present invention, a conductive groundplane is embodied in a laminate of plastic foam. The conductive sheet is preferably defined by a conductive fabric such as a weave or knit of metallic or metallic-plated fibers The laminate includes a relatively stiffer foam layer to define a shape, and a relatively soft foam laminate which insulates between the conductive layer and the circuit being shielded. To effect at least one electrical connection between the conductive sheet and the circuit, a spring pin is mounted on the circuit to protrude toward the groundplane. The spring pin pierces the soft foam layer and engages the conductive layer. Preferably the spring pin includes a post which is soldered rigidly to the circuit, and a movable shaft that protrudes axially from the post at the distal end. The movable shaft can have an enlarged end and a shaft that is helically fluted in the manner of a twist drill The flutes of the shaft can engage a guide on the post so as to twist the shaft with axial displacement relative to the post. Accordingly, when the spring pin is forced through the soft foam into the conductive fabric, the pin pierces through the conductive fabric such that the enlarged end passes through and locks behind the fabric. Any subsequent vibration is countered in several ways. The resilient foam layers hold the pin in position while admitting some relative motion The pin locked in the fabric maintains good electrical connection due to the locking and also due to the fact that the flutes tend to engage in the metallic material of the fabric.

The groundplane arrangement according to the invention can form a ready packing element to be disposed between a printed circuit card or the like and an outer housing. The groundplane material thus forms a resilient vibration resistant lining for the outer housing, providing a very good connection to the conductive sheet, and therefore maintaining effective shielding. Insofar as the outer housing includes conductors, the invention insulates the circuit card from shorting against the outer housing. These advantages are made possible even though installation is extremely simple. The laminate material is simply placed and the circuit card (with protruding spring pin) is urged against the laminate until the spring pin punches through the soft foam to engage with the conductor.

Unlike an arrangement wherein a pin piercing a metal foil tends gradually to enlarge the hole in the foil due to relative motion between the pin and the foil in the plane of the foil, eventually losing electrical contact, the enlarged pin end, helical fluting and engagement with a conductive fabric according to the invention are such that vibration tends to improve the electrical connection of the pin and the conductive fabric.

SUMMARY OF THE INVENTION

It is an object of the invention to provide a groundplane structure that has aspects of a resilient electrically insulating packing material and aspects of a conductive sheet, which structure is readily connectable electrically to a connection point of electrical equipment to be shielded It is a further object of the invention to facilitate electrical connection between a conductive sheet defining a groundplane and a circuit card or the like, in a manner that is insensitive to relative movement of the circuit card and the conductive sheet due to vibration.

It is a further object of the invention to provide an electrical connection for a conductive sheet in the form of a conductive fabric, wherein a connection pin is movably adapted to electrically and mechanically engage the fabric.

These and other objects are accomplished by a laminated groundplane structure for shielding electrical equipment such as printed circuit boards, having a conductive sheet sandwiched between a soft foam layer and a rigid foam layer A connection pin coupled to the printed circuit board or the like pierces the soft foam layer to engage in the conductive sheet The groundplane can include, in order, laminated layers of soft closed cell foam an insulating dielectric layer, a conductive fabric defining the conductive sheet, and a relatively rigid foam for maintaining a shape in the groundplane structure. The connection pin includes a conductive post protruding toward the groundplane, and a movable conductive shaft which is spring biased to protrude axially relative to the conductive post for piercing the conductive sheet through the soft foam layer. The movable shaft resembles a twist drill with an enlarged or barbed head, which passes through the conductive sheet to engage in filaments of the conductive sheet. The conductive shaft is helically fluted over at least a part of its length engaging the filaments of the conductive sheet. The arrangement is particularly useful in mounting circuit cards in conductive housings of equipment subject to vibration, for example automobiles, because the groundplane structure resiliently cradles the circuit card while the connection pin bites into the conductive sheet due to engagement of the barbed head, the fluted shaft and the filaments of the sheet.

In order to mount a circuit card in a protective box, which may include conductive surfaces to be isolated from the circuit card, the groundplane structure is placed in the box along at least one wall (e.g., a bottom of the box), with the soft foam layer facing inwardly. The circuit card is provided with the connection pin, protruding in a spring biased manner from the circuit card toward the ground plane. When the circuit card is placed against the groundplane structure, the connection pin pierces the soft foam layer and the conductive fabric, thus making an electrical connection, for example between circuit card ground and the conductive fabric. With subsequent vibration, the spring biased nature of the connection pin maintains contact with the conductive fabric, the helical flutes of the pin and the barbed or enlarged head tending to engage in the conductive fabric notwithstanding relative motion of the circuit and the groundplane, and without substantially enlarging the hole in the conductive sheet formed by piercing the conductive sheet with the pin. Should the circuit card be removed and replaced, the pin normally can be placed at a slightly different location, thus ensuring a fresh and dependable electrical connection.

Other aspects of the invention will be apparent in view of the following discussion of particular examples.

BRIEF DESCRIPTION OF THE DRAWINGS

The invention is discussed herein with reference to an exemplary embodiment as shown in the attached drawings It should be understood that the invention is capable of other particular embodiments in accordance with the description of the invention and the appended claims In the drawings.

DETAILED DESCRIPTION OF THE PREFERRED EMBODIMENTS

Figure 1:
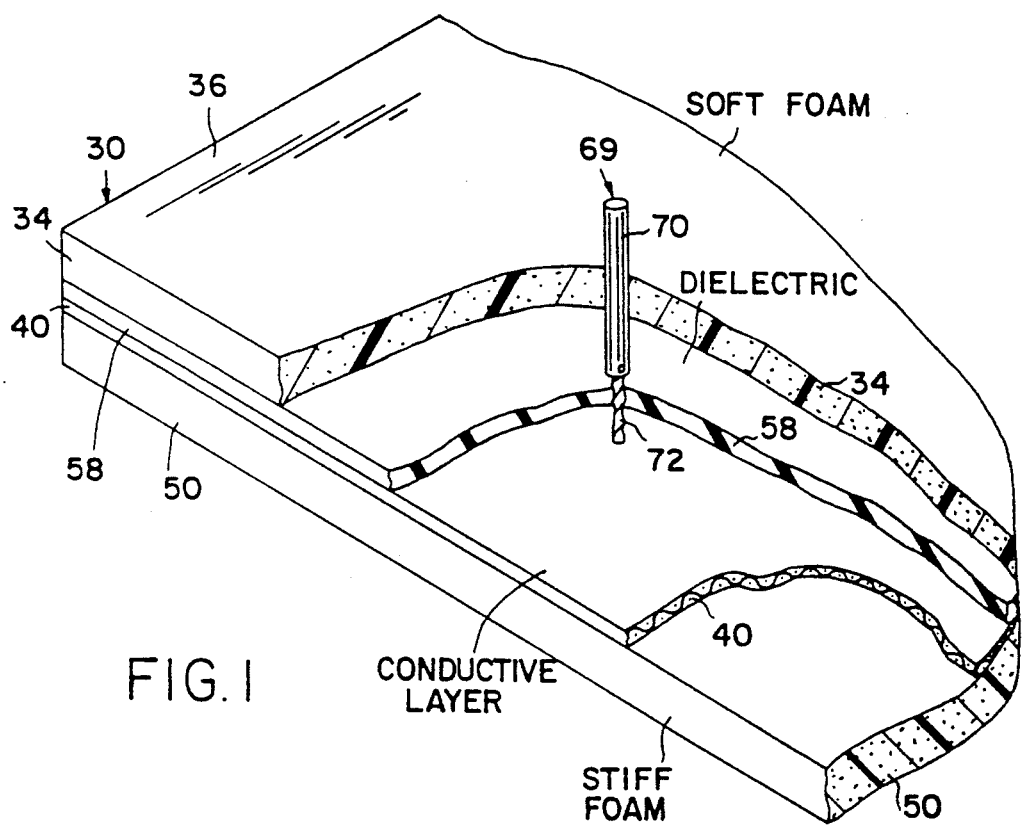
FIG. 1 is a cutaway perspective view showing a groundplane structure according to the invention.
Figure 2:
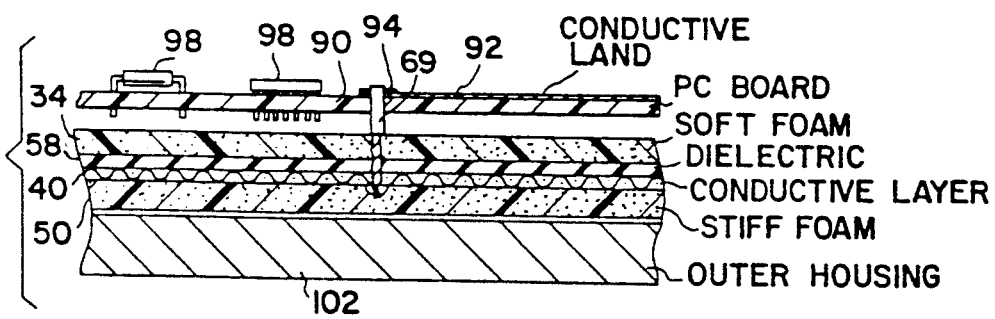
FIG. 2 is a partial sectional elevation view, showing the groundplane of the invention as applied to a printed circuit board disposed in a housing.

A laminated groundplane structure 30 for shielding electrical equipment such as printed circuit boards is shown generally in FIG. 1, in a partially cutaway perspective view. The groundplane structure includes a conductive sheet 40, which is to be connected electrically to another circuit element, such as a point ground on a printed circuit board. In FIG. 1, the groundplane structure and connecting pin 69 therefor are shown apart from any printed circuit board. In FIG. 2, printed circuit board is to the conductive layer of a laminated groundplane structure according to the invention via pin 69, and furthermore the printed circuit board and groundplane are disposed in an outer housing.

Referring to FIGS. 1 and 2, the conductive layer 40 is sandwiched between a soft foam layer 34 and a rigid foam layer 50. The connection pin 69 is coupled to a conductive land 92 on the printed circuit board 90 or the like, for example at a solder junction 94. Pin 69 pierces the soft foam layer 34 to engage in the conductive sheet 40, to effect the electrical connection.

Figure 3:
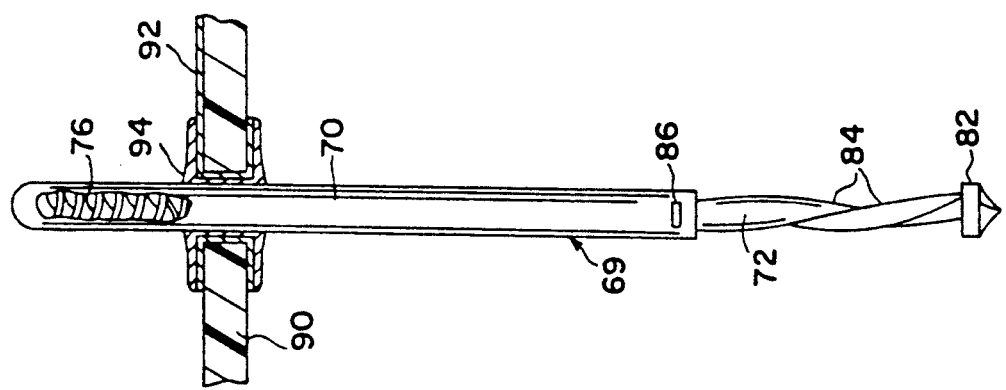
FIG. 3 is a section view through a printed circuit board having a connection pin for point connection of a conductor on the circuit card to the groundplane; and, FIG. 4 is an exploded perspective view illustrating application of the invention to a printed circuit card to be mounted in an outer housing.

The groundplane structure 30 preferably includes, in order, laminated layers of soft closed cell foam 34, an insulating dielectric layer 58, a conductive fabric defining the conductive sheet 40, and a relatively rigid foam 50 for maintaining a shape in the groundplane structure. The connection pin 69 includes a conductive post or tube 70 which carries a movable conductive shaft 72. Movable shaft 72 is in contact with the conductive post or tube 70, and is spring biased to protrude axially relative to the conductive post for piercing the conductive sheet 40 through the soft foam layer 34. The movable shaft 72 resembles a twist drill with an enlarged or barbed head. The barbed head preferably passes through the conductive sheet 40 as shown in FIG. 2, to engage in filaments of the conductive sheet. The conductive shaft 72 is helically fluted over at least a part of its length engaging the filaments of the conductive sheet, the helical flutes defining edges which tend to bite into the conductive filaments, especially because the movable shaft 72 is arranged to twist relative to the tube 70 with relative motion between the printed circuit card and the conductive layer 34 due to a guide part 86 of the post 70 bearing against the helical flutes, as shown in FIG. 3.

Figure 4:
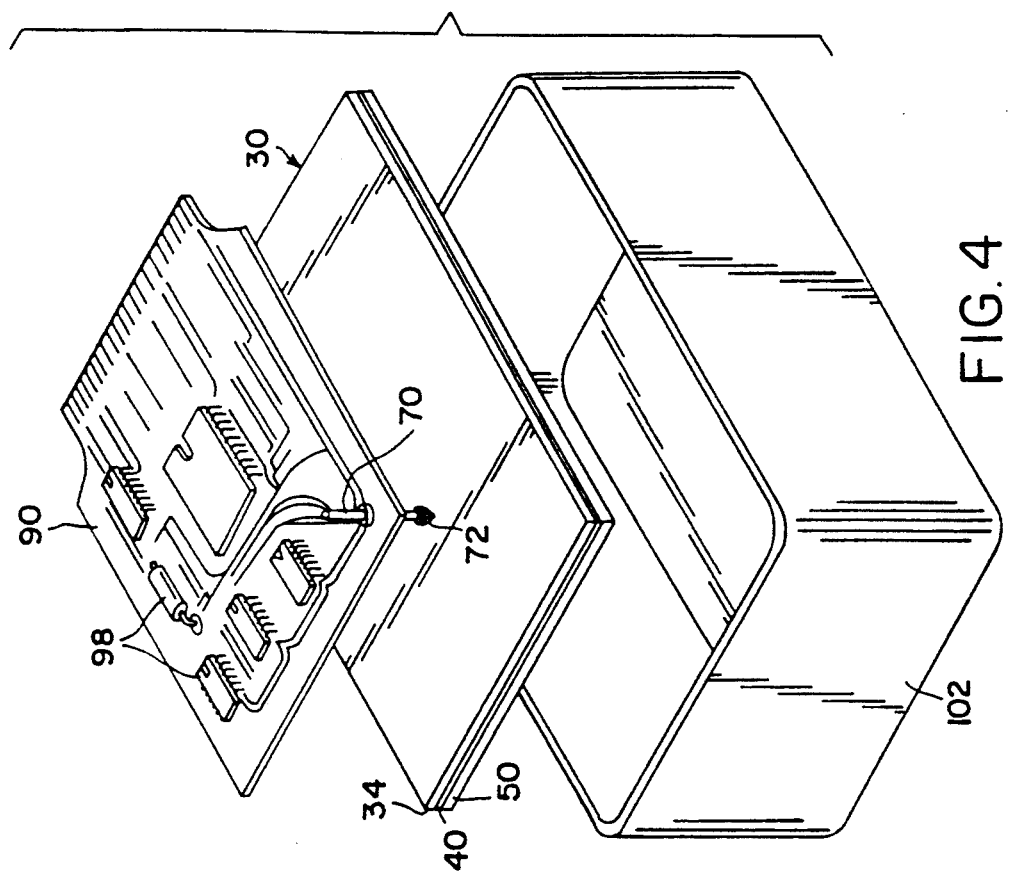

The arrangement according to the invention is particularly useful in mounting circuit cards in conductive housings of equipment subject to vibration, for example automobiles. Such an apparatus is shown in FIG. 4. The groundplane structure 30 resiliently cradles the circuit card 90 while the connection pin 72 bites into the conductive sheet 40 due to engagement of the barbed head, the fluted shaft and the filaments of the sheet.

The groundplane structure 30 forms an apparatus for shielding against propagation of electromagnetic interference by defining a sheet conductor at ground potential, in which induced currents are dissipated by resistive heating due to eddy currents. Whereas the sheet conductor 40 could be attached to the shielded item at more than one place for detuning coupling between components on a circuit card or the like, preferably the sheet conductor is attached at one point via a conductive pin coupled to a ground point on the shielded item. The conductive pin 69 pierces a layer of soft foam disposed on a side of the conductive sheet facing the circuit card, and passes through the sheet of conductive material laminated thereto. A further layer of foam can be laminated onto the conductive sheet on a side opposite from the printed circuit card or the like, the further layer insulating the conductive sheet against contact with outer housing The softer layer of foam can be a urethane or other polymer foam, preferably having a closed cell surface whereby the pin 69 punches through the foam to engage in the conductive sheet. A soft foam can be made by frothing or chemically blowing a polymer such as urethane during curing. The soft foam cushions the circuit card against vibration and shock. As a result of such cushioning, the circuit card can be expected to move relative to the outer housing in which the groundplane structure is disposed, and more particularly to move relative to the conductive sheet. The conductive layer could be a foil sheet, but relative motion of the pin in the plane of a foil sheet pierced by the pin can cause the hole made by the pin to become enlarged, eventually losing electrical contact with the conductive sheet. The particular nature of the connection pin 69 and the conductive sheet 40 according to the invention prevent a loss of electrical contact between the pin and the conductive sheet The pin 69 has a spring mounted distal end, which accommodates some relative movement, and fluted cutting edges which are twisted relative to the conductive sheet as the movable distal end of the pin is advanced and retracted.

The rigid foam layer 50 is preferably provided to define a specific shape of the shielding structure. Foam layer 50 can be polystyrene foam or other relatively rigid, preferably insulating material. The shape can be planar as shown in the examples, or non-planar. For example, an enclosure defining the bottom and sidewalls of a box can be formed of rigid foam, with the conductive sheet and soft foam lining the box. It is also possible to use an outer layer 50 that is flexible (or to omit the outer layer, for example, where the shielded apparatus is to be housed in a nonconductive enclosure). In connection with flexible shielding structures, circuit cards or the like can be wrapped in the shielding material, with the connection pin protruding from the circuit card at least at one point to effect electrical connection to the conductive sheet in the shield.

The conductive material preferably includes a fabric of conductive filaments. The filaments can be metal wires woven, knitted or otherwise formed into a sheet. Alternatively, the filaments can be metal coated or plated filaments of a nonconductive material. The material can be, for example, a metal plated nylon fabric or the like, as disclosed in U.S. Pat. No. 4,857,668—Buonanno, which is hereby incorporated. Such a material is durable notwithstanding the action of the movable end 72 of the connection pin 69, and maintains good electrical contact with the fluted edges of the pin.

The connection pin is shown in detail in FIG. 3. The proximal end of the pin 69 defines a tube 70 in which the movable end 72 telescopes. Tube 70 is electrically and mechanically connected to the circuit card 90 In particular the tube is coupled to connection land 92 by means of solder junction 94. A spring 76 urges pin 72 axially downwardly toward the distal end. An inward depression 86 is provided in the tube 70 at a point passed by the movable end 72. Depression 86 defines a reduction in the internal diameter of the tube 70, forming a guide that interacts with the helically fluted walls of the end 72, and also prevents complete extraction of the movable end 72 from the tube 70. The tube 70 acts as a nut and the end 72 as a screw. As the end 72 is advanced or retracted, the helical flutes guide on the inner wall of depression 86, causing the movable pin end 72 to twist.

The movable pin part 72 can be spring biased to rest against a stop at full extension of pin 72. Alternatively, the pin can be carried at a rest position of the spring 76, being thereby free to move (subject to spring bias) in either direction from the rest position. At its retracted position, however, pin 72 must protrude sufficiently to ensure that the distal end of the pin will pass through the conductive layer when the circuit card or the like is pressed against the shield material The pin can be made to protrude from the circuit card by a distance substantially equal to or slightly greater than the thickness of the soft foam layer, which will be compressed as the circuit card is pressed against the shield, allowing the pin 72 to pierce the soft foam and the conductive sheet.

The relatively more rigid layer of foam which is disposed between the conductive sheet 40 and the outer housing 102 tends to hold the groundplane structure in a fixed shape, and preferably is an electrical insulator. Between the soft foam layer on the other side of the groundplane structure and the printed circuit card or the like, a dielectric layer can be laminated to the body of the groundplane. This arrangement makes the groundplane act effectively as an electrode of a decoupling capacitor between circuit conductors and ground, for reducing electromagnetic coupling of the components on the circuit card, especially at high frequencies.

FIGS. 2 and 4 illustrate particular applications of the groundplane according to the invention to mountings of printed circuit cards. In FIG. 2, the circuit card 90 is shown disposed on the groundplane structure, which in turn is placed on an inner wall of an outer housing. The groundplane panel 30 thus defines at least a partial enclosure for blocking propagation of electromagnetic interference. Similar groundplane shielding means can be used in other orientations relative to the circuit card, for example to wholly enclose circuit elements which either generate or are sensitive to electromagnetic interference by fully lining their enclosure. Alternatively, and as shown in FIG. 4, the groundplane can be simply placed under the circuit card (and preferably immediately adjacent the circuit card), to reduce coupling between the components 98 that would otherwise occur with high frequency fields generated by certain of the components inducing spurious currents in others of the components. As another possible application, a flexible version of the shield structure (i.e., where the backing foam layer 50 is soft enough to fold) can be used to fold around a printed circuit card or the like, with the connection pin protruding at least at one point to electrically connect the circuit card to the conductive sheet in the shield.

As in the foregoing discussion, the groundplane 30 of FIGS. 2 and 4 defines a laminated body having a soft foam layer 34 and a conductive sheet 40 arranged substantially coextensively. A connection pin 69 is coupled to the connection point 94 of the circuit and protrudes from the printed circuit board or other substrate toward the groundplane. The connection pin 69 pierces the soft foam layer 34 to engage in the conductive sheet 40, whereby the connection point of the circuit is coupled to the groundplane through the connection pin.

The pin 69 includes a conductive post 70 fixed relative to the printed circuit board or other substrate and a conductive shaft 72 electrically coupled to and movable relative to the post 70. The conductive shaft 72 is spring biased to protrude axially relative to the conductive post 70 for piercing the conductive sheet through the soft foam layer.

Whereas the conductive sheet preferably is a conductive fabric having filaments, and the conductive shaft has an enlargement or barbed head at its distal end, the pin end 72 locks nicely into electrical contact with the conductive sheet by passing through and engaging the conductive filaments of the fabric The enlargement passes through the soft foam layer and through the conductive sheet such that the barbed head of the pin end 72 engages in the filaments. The barbed head is preferably pointed to more easily pierce the foam and the conductive sheet. The conductive shaft 72 is helically fluted over at least a part of a length of the conductive shaft engaging said filaments, with the helical flutes tending to bite into the conductive sheet, especially when the shaft 72 is rotated, for example by means of a guide member on the pin portion 70, guiding on the helical flutes for urging the shaft 72 to rotate with axial displacement of end 72.

The invention having been disclosed, variations on the concept within the scope of the invention will now become apparent to persons skilled in the art. Reference should be made to the appended claims rather than the foregoing discussion of exemplary embodiments, in order to assess the scope of the invention in which exclusive rights are claimed.

I claim:

1. A shielding arrangement for a circuit the circuit being mounted on a substrate and having a connection point, the arrangement comprising:
   a groundplane defining at least a partial enclosure for blocking propagation of electromagnetic interference, the groundplane including a laminated body having a soft foam layer and a conductive sheet arranged substantially coextensively;
   a connection pin coupled to the connection point of the circuit and protruding from the substrate toward the groundplane; and,
   wherein the connection pin pierces the soft foam layer to engage in the conductive sheet, whereby the connection point of the circuit is coupled to the groundplane through the connection pin.

2. The shielding arrangement according to claim 1, wherein the laminated body of the groundplane includes said soft foam layer, said conductive sheet and a layer of relatively more rigid foam disposed on the groundplane on a side opposite from the soft foam layer.

3. The shielding arrangement according to claim 2, further comprising a dielectric layer laminated to the groundplane between the soft foam layer and the conductive sheet.

4. The shielding arrangement according to claim 1, wherein the pin includes a conductive post fixed relative to the substrate and a conductive shaft electrically coupled to and movable relative to the post, the conductive shaft being spring biased to protrude axially relative to the conductive post for piercing the conductive sheet through the soft foam layer.

5. The shielding arrangement according to claim 4, wherein the conductive sheet is a conductive fabric having filaments.

6. The shielding arrangement according to claim 5, wherein the conductive shaft has an enlargement adjacent a distal end thereof, the enlargement passing through the conductive sheet to engage in the filaments.

7. The shielding arrangement according to claim 6, wherein the conductive shaft is helically fluted over at least a part of a length of the conductive shaft engaging said filaments.

8. The shielding arrangement according to claim 7, wherein the enlargement defines a pointed head for piercing the conductive sheath, a rear portion of the pointed head forming a barb and the helically fluted part of the conductive shaft being disposed behind the barb in a direction of piercing of the conductive sheet.

9. A shielded electrical apparatus, comprising:

a circuit mounted on a substrate, the circuit being at least one of sensitive to induced electromagnetic interference and apt to generate electromagnetic interference;

a conductive connection pin electrically coupled to the circuit at a connection point and protruding relative to the substrate;

a groundplane defining a conductive sheet arranged adjacent the circuit, the groundplane having a layer of nonconductive foam disposed on a side facing the circuit and pierced by the connection pin to electrically couple the connection point to the conductive sheet.

10. The shielded electrical apparatus according to claim 9, wherein the groundplane includes a layer of nonconductive material on an opposite side of the conductive sheet from the nonconductive foam.

11. The shielded electrical apparatus according to claim 10, wherein the groundplane includes, in order, laminated layers of soft foam defining said nonconductive foam, an insulating dielectric layer, a conductive fabric defining the conductive sheet, and a relatively rigid foam.

12. The shielded electrical apparatus according to claim 11, wherein the connection pin includes a conductive post fixed relative to the substrate and a conductive shaft electrically coupled to and movable relative to the post, the conductive shaft being spring biased to protrude axially relative to the conductive post for piercing the conductive sheet through the soft foam layer.

13. The shielded electrical apparatus according to claim 12, wherein the conductive shaft has an enlargement adjacent a distal end thereof, the enlargement passing through the conductive sheet to engage in filaments of the conductive sheet.

14. The shielded electrical apparatus according to claim 13, wherein the conductive shaft is helically fluted over at least a part of a length of the conductive shaft engaging said filaments.

15. The shielded electrical apparatus according to claim 14; wherein the enlargement defines a pointed head for piercing the conductive sheath, a rear portion of the pointed head forming a barb and the helically fluted part of the conductive shaft being disposed behind the barb in a direction of piercing of the conductive sheet.

16. A method for shielding an electrical circuit, comprising the steps of:

mounting a conductive pin to protrude from the electrical circuit;

placing the electrical circuit against a shield material including a soft nonconductive foam directed toward the electrical circuit and a conductive sheet; and, urging the electrical circuit against the shield material to cause the conductive pin to pierce the foam and engage the conductive sheet.

17. The method according to claim 16, wherein the conductive sheet is a conductive fabric and the conductive pin includes at least one of an enlarged head, a barbed head and a helically fluted shaft defining an engagement means, and wherein said urging causes the engagement means to electrically connect to the conductive fabric.

* * * * *

UNITED STATES PATENT AND TRADEMARK OFFICE
CERTIFICATE OF CORRECTION

PATENT NO. : 5,313,015  
DATED : May 17, 1994  
INVENTOR(S) : William Hoge

Page 1 of 2

It is certified that error appears in the above-indentified patent and that said Letters Patent is hereby corrected as shown below:

In the Abstract [57], line 16, change "layer The" to --layer. The--.

Column 1, line 49, change "sheet Such" to --sheet. Such--.

Column 2, line 11, change "propagation Flexibility" to read --propagation. Flexibility--.

Column 2, line 48, "arrangement In" should read --arrangement. In--.

Column 2, line 68, "drill The" should read --drill. The--.

Column 3, line 43, insert --.-- after "shielded".

Column 3, line 60, "sheet The" should read --sheet. The--.

Column 3, line 62, "foam an" should read --foam, an--.

Column 4, lines 42-43, "drawings It" should read --drawings. It--.

UNITED STATES PATENT AND TRADEMARK OFFICE
CERTIFICATE OF CORRECTION

PATENT NO. : 5,313,015
DATED : May 17, 1994
INVENTOR(S) : William Hoge

It is certified that error appears in the above-indentified patent and that said Letters Patent is hereby corrected as shown below:

Column 5, line 1, insert --a-- before "printed".

Column 5, line 2, insert --grounded-- after "is".

Column 6, line 13, "sheet The" should read --sheet. The--.

Column 7, line 2, "material The" should read --material. The--.

Column 7, line 67, "fabric The" should read --fabric. The--.

Column 8, line 20, insert --,-- after "circuit", first occurrence.

Signed and Sealed this

Sixth Day of September, 1994

Attest:

BRUCE LEHMAN

*Attesting Officer*  *Commissioner of Patents and Trademarks*